United States Patent [19]

Saimoto

[11] Patent Number: 4,995,818
[45] Date of Patent: Feb. 26, 1991

[54] BUS BAR INTERLAYER CONNECTOR STRUCTURE IN JUNCTION BOX

[75] Inventor: Tetsuro Saimoto, Kosai, Japan

[73] Assignee: Yazaki Corporation, Tokyo, Japan

[21] Appl. No.: 494,416

[22] Filed: Mar. 16, 1990

[30] Foreign Application Priority Data

Mar. 17, 1989 [JP] Japan .................................. 1-29782

[51] Int. Cl.[5] ............................................. H01R 9/09
[52] U.S. Cl. ........................................ 439/74; 439/76
[58] Field of Search ...................... 439/74, 75, 76, 45, 439/65, 212, 213, 695; 361/413, 414; 174/71 B, 72 B, 88 B

[56] References Cited

U.S. PATENT DOCUMENTS

| | | | |
|---|---|---|---|
| 4,355,853 | 10/1982 | Kourimsky | 439/65 |
| 4,781,600 | 11/1988 | Sugiyama et al. | 439/65 |
| 4,781,621 | 11/1988 | Sugiyama et al. | 439/76 |

FOREIGN PATENT DOCUMENTS 54-10489  7/1979  Japan .

Primary Examiner—Neil Abrams
Assistant Examiner—Khiem Nguyen
Attorney, Agent, or Firm—Venable, Baetjer and Howard

[57] ABSTRACT

A bus bar interlayer connector structure for use in a junction box comprises a bus in one layer having a tab formed with a longitudinal slit and bent at the central part of the slit at right angles to the bus bar body, and another bus bar in another layer having an elongated hole formed therein and adapted to be pierced with the tab for fixedly securing the latter. The above-mentioned slit extends past the bent base portion of the tab to a pattern portion of the bus bar in another layer. Thus, the bus bar interlayer connection can be ensured, and also the size of the junction box using this connector structure, which requires less space for installation, can be reduced correspondingly.

5 Claims, 3 Drawing Sheets

BUS BAR INTERLAYER CONNECTOR STRUCTURE IN JUNCTION BOX

BACKGROUND OF THE INVENTION

1. Field of the Invention

This invention relates to improvements in bus bar interlayer connector structure forming the internal circuit of a junction box which is used for interconnection of wire harnesses, or the like.

2. Description of the Prior Art

As a prior art connector structure of the kind specified above, there is known a connector structure wherein, as described in Japanese Utility Model Laid-Open No. 101489/79, one of bus bars in different layers has a raised tab formed by bending it at right angles to the bus bar body, whilst another bus bar has an elongated hole formed therein, the tab having a longitudinal slit formed therein to afford it a resiliency, the slit tab being forced through the elongated hole in the another bus bar.

To afford the tab a proper resiliency, it is essential for the longitudinal slit of the tab to have a predetermined length, which results in increase in the height of the tab raised portion.

This means that when the tab is formed by punching a sheet metal the developed length thereof will increase, thus reducing the number of bus bars which can be wired in a predetermined space. Further, since the tab is required to be connected in the middle of the height thereof, namely, in the central portion of the longitudinal slit with the other bus bar, the interlayer distance of the bus bars will increase, thus bringing about disadvantages such as increase in the space for wiring bus bars and increase in the size of the junction box.

Further, the leading end portion of the tab is rounded to facilitate the force-fit of the tab through the elongated hole in the other bus bar.

However, since the width of the round portion terminating zone is equal to that of the straight side starting zone, when the tab is forced through the elongated hole, the edge of the hole is scraped off. As a result, the amount of flexure of the central portion of the tab to be connected with the other bus bar is reduced, thus reducing the contact pressure.

Accordingly, an object of the present invention is to provide a bus bar interlayer connector structure wherein even in case the height of the raised portion of the tab is reduced a high resiliency, and hence a high contact pressure can be obtained.

Another object of the present invention is to provide a connector structure wherein the contact pressure of the tab to be forced through the elongated hole at the connecting position thereof can be increased so as to make safer electrical connection.

SUMMARY OF THE INVENTION

The present invention provides a bus bar interlayer connector structure for use in a junction box, comprising a bus bar in one layer having a tab formed with a longitudinal slit and bent at the central part of the slit at right angles to the bus bar body, and another bus bar in another layer having an elongated hole formed therein and adapted to be pierced with the tab for fixedly securing the latter, characterized in that the longitudinal slit extends past the bent base portion of the tab to a pattern portion of the bus bar in another layer.

DESCRIPTION OF THE PREFERRED EMBODIMENTS

The above-mentioned construction of the present invention will be described below concretely with reference to the drawings showing several embodiment thereof.

Figure 1:
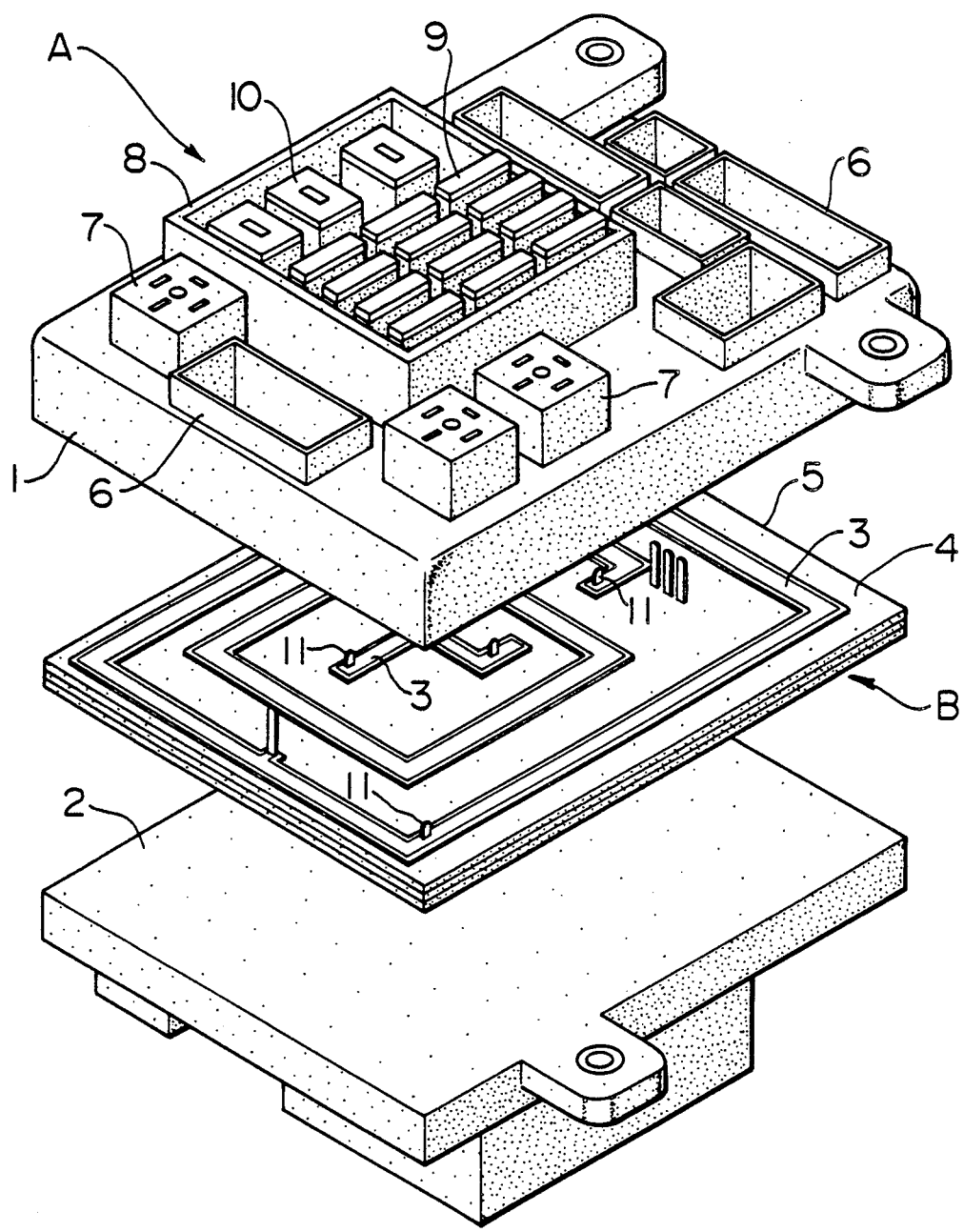
FIG. 1 is an exploded perspective view of a junction box using the connector structure according to the present invention.

In FIG. 1, reference character A denotes a junction box which comprises an upper cover 1, a lower cover 2, and a laminated wiring board B which is accommodated between the upper and lower covers 1 and 2 and which is formed by putting one on top of the other wiring board assemblies 5 each consisting of a plurality of bus bars 3 and an insulating board 4.

In the drawings, reference numeral 6 denotes a connector for wiring harness, 7 a connector for relay, 8 a connector portion for fuse. The connector portion 8 has a plurality of fuses 9 and a plurality of fusible links 10 mounted thereon.

In the laminated wiring board B, the bus bar 3 in the uppermost layer is connected with the bus bars in lower layers by means of tabs 11, thereby making interlayer electrical connections.

Figure 2:
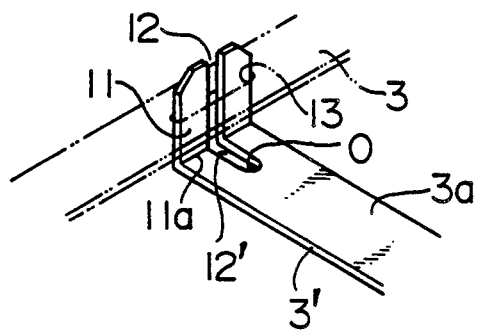
FIG. 2 is an enlarged perspective view showing the same connector structure.

FIG. 2 shows an enlarged construction of the above-mentioned interlayer connecting portion.

Stating more specifically, the tab 11 of a bus bar 3' in the lower layer which is forced through an elongated hole 13 formed in a bus bar 3 in the upper layer is divided by a central longitudinal slit 12 into the left and right portions. Further, the longitudinal slit 12 is formed so as to extend past a bent base portion 11a of the tab 11 to a horizontal pattern portion of the bus bar 3'. The extension of the slit 12 defined in the horizontal pattern portion 3a is indicated with 12'.

The function of the connector structure will be described below. Since the longitudinal slit 12 extends to the pattern portion 3a, the fulcrum of the tab which serves as a spring is shifted to a termination "0" of the extension 12' of the slit 12.

Figure 3A:
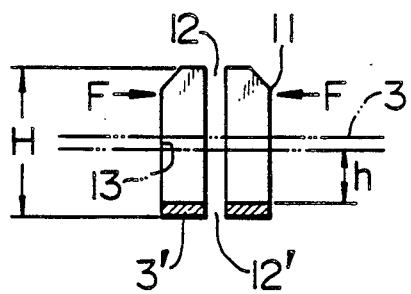
FIG. 3A and 3B are a front view and a sectional view of the connecting portion to explain the function thereof.
Figure 3B:
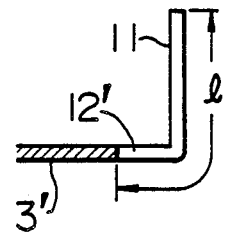

Thus, as shown in FIGS. 3A and 3B, if the force F exerted on the tab 11 when it is forced through the elongated hole 13 is kept constant, then the resultant impulse (F X l) will increase so that the maximum displacement of the tab serving as a spring which ensures a sufficiently high resiliency can be increased correspondingly. Reference character l denotes the overall length of the longitudinal slit.

As a result, the height H of the raised portion of the tab 11 is reduced, thus reducing correspondingly the interlayer connection distance h between the upper and lower bus bars 3 and 3'. This reduces the developed length of the tab 11 so that the bus bar wiring density can be improved and also reduction in the size of the junction box can be achieved by the space reduction.

Further, since the tab 11 is divided by the longitudinal slit 12 into two halves when it is forced through the elongated hole 13, the left and right portions thereof are flexed inwardly towards each other, so that there is no risk of the edge of the hole 13 being scraped off, unlike the prior art connection structure.

Figure 4:
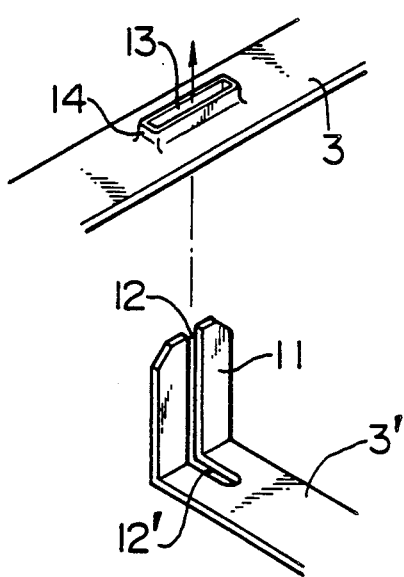
FIGS. 4 to 6 ar perspective views showing other embodiments, respectively, of the connector structure of the present invention.

FIG. 4 illustrates an embodiment wherein an elongated hole 13 is formed with a surrounding wall 14 by a drawing process when the hole 13 is made in the bus bar 3 in the upper layer.

In this case, the area of contact between the tab 11 and the bus bar 3 will increase so as to prevent the tab 11 from jolting when it is forced through the elongated hole 13, thereby rendering the electrical connection between the upper and lower bus bars 3 and 3' more stable.

Figure 5:
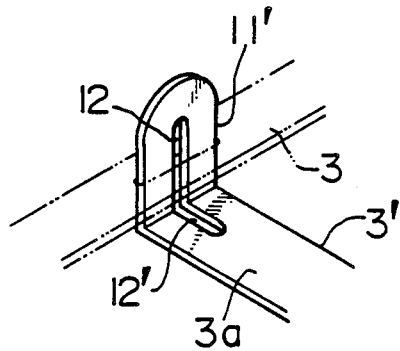

FIG. 5 shows a further embodiment wherein longitudinal slit 12 of a tab 11' of the same shape as the prior art tab extends to the pattern portion 3a of the bar 3'. The extension of the longitudinal slit 12 is denoted with reference numeral 12'.

Figure 6:
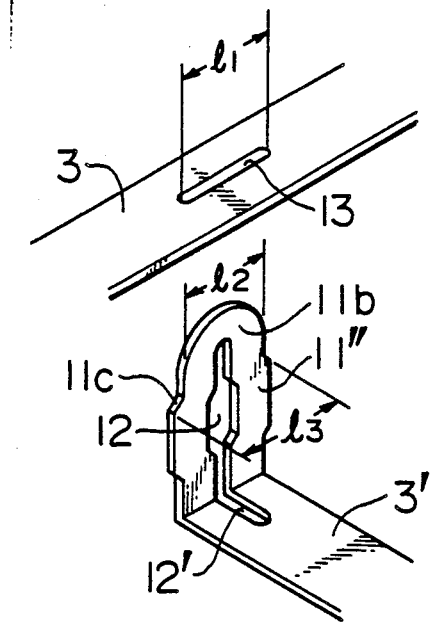
Figure 7:
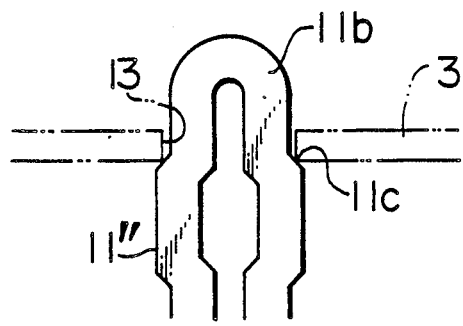
FIG. 7 is an explanatory view showing the dimensional relationship between the tab and the elongated hole.

FIGS. 6 and 7 show a still further embodiment wherein the tab 11 has a force-fit guide portion 11b which has a width $l_2$ considerably narrower than the length $l_1$ of the elongated hole 13 and which is formed in the leading end portion thereof following or adjacent to a tapered portion 11c. The central portion of the tab 11 has a width $l_3$ which has the following relationship to $l_1$ and $l_2$.

$$l_3 > l_1 > l_2$$

The dimensional relationship between the width $l_2$ of the force-fit guide portion 11b and the length $l_1$ of the elongated hole 13 is preset so as to accommodate variations in the distance between the upper and lower bus bars 3 and 3' when assembled, and dimensional tolerances of the tab 11 and the elongated hole 13.

In the case of this embodiment, since the width $l_2$ of the force-fit guide portion 11b is smaller than the length $l_1$ of the elongated hole 13, positioning of the tab 11 can be made easily. Further, when the tab 11 is forced through the elongated hole 13, there is no risk of the central portion of the tab 11' forming the spring portion thereof being scraped or chip off by the edge of the elongated hole 13, thus providing a stable contact pressure.

Figure 8:
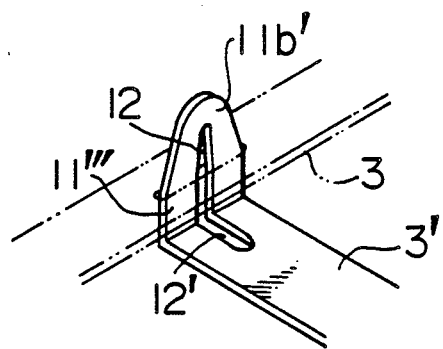
FIG. 8 is a perspective view showing a further embodiment of the connector structure according to the present invention.

FIG. 8 shows a still another embodiment wherein the tab 11 has a substantially triangular force-fit guide portion 11b' formed in the leading end portion thereof.

This embodiment also enables the same effect as in the case of the embodiment shown in FIG. 6 to be achieved.

As described hereinabove, according to the bus bar interlayer connector structure according to the present invention, even in case the height of the raised portion of the tab is reduced, a satisfactory contact pressure can be obtained between the tab and the elongated hole so that improvements in bus bar wiring density and reduction in space for installation can be obtained thereby reducing substantially the size of the junction box using this bus bar interlayer connector structure.

It is to be understood that the foregoing description is merely illustrative of preferred embodiments of the present invention, and that the scope of the invention is not to be limited thereto, but is to be determined by the scope of the appended claims.

What is claimed is:

1. A bus bar interlayer connector structure for use in a junction box, comprising a bus bar in one layer having a tab with a leading end portion formed with a longitudinal slit and bent at the central part of the slit at right angles to the bus bar body, and another bus bar in another layer having an elongated hole formed therein and adapted to be pierced with said tab for fixedly securing the latter, wherein said longitudinal slit extends past the bent base portion of the tab to a pattern portion of the bus bar in said one layer.

2. A connector structure according to claim 1, wherein the longitudinal slit extends to the tip or leading end of the tab, and the tab is divided by the slit into two parts.

3. A connector structure according to claim 1, wherein a surrounding wall is formed around the elongated hole.

4. A connector structure according to claim 1, wherein the tab has a force-fit guide portion formed integrally in the leading end portion thereof and having a width substantially less than the length of the elongated hole.

5. A connector structure according to claim 4, wherein the force-fit guide portion is of approximately triangular shape.

* * * * *